United States Patent [19]

Cini et al.

[11] Patent Number: 4,673,889

[45] Date of Patent: Jun. 16, 1987

[54] APPARATUS AND METHOD FOR MUTING AN OUTPUT SIGNAL IN A SWITCHING AMPLIFIER

[75] Inventors: Carlo Cini, Cornaredo; Claudio Diazzi; Pietro Erratico, both of Milan, all of Italy

[73] Assignee: SGS Microelettronica S.p.A., Agrate, Italy

[21] Appl. No.: 809,506

[22] Filed: Dec. 16, 1985

[30] Foreign Application Priority Data

Mar. 13, 1985 [IT] Italy ................................ 19868 A/85

[51] Int. Cl.[4] .............................................. H03F 3/38
[52] U.S. Cl. ........................................ 330/10; 330/51; 330/149; 330/251
[58] Field of Search ................. 330/10, 251, 207 A, 330/51, 149, 297

[56] References Cited

U.S. PATENT DOCUMENTS 3,889,202  6/1975  Suzuki ................................... 330/51
3,976,955  8/1976  Hamada ............................. 330/10 X

OTHER PUBLICATIONS

Klynin, "Direct-Current Amplifier with Frequency-Pulse-Width Modulation", *Instrum. & Exp. Tech.* vol. 19, No. 5, Sep.–Oct. 1976, pp. 1415–1417.

*Primary Examiner*—James B. Mullins
*Attorney, Agent, or Firm*—Harry M. Weiss & Associates

[57] ABSTRACT

In an audio switching power amplifier, muting apparatus provided for eliminating noise signals associated with turn-on and turn-off operations of the apparatus is disclosed. The muting apparatus disables the output power amplifiers and controls signal levels at various positions in the power amplifier to reduce transient conditions. Control apparatus applies the muting signals to the power amplifier during a predetermined period during start-up of the amplifier and applies the muting conditions immediately upon the turning off of power to the power amplifier.

9 Claims, 2 Drawing Figures

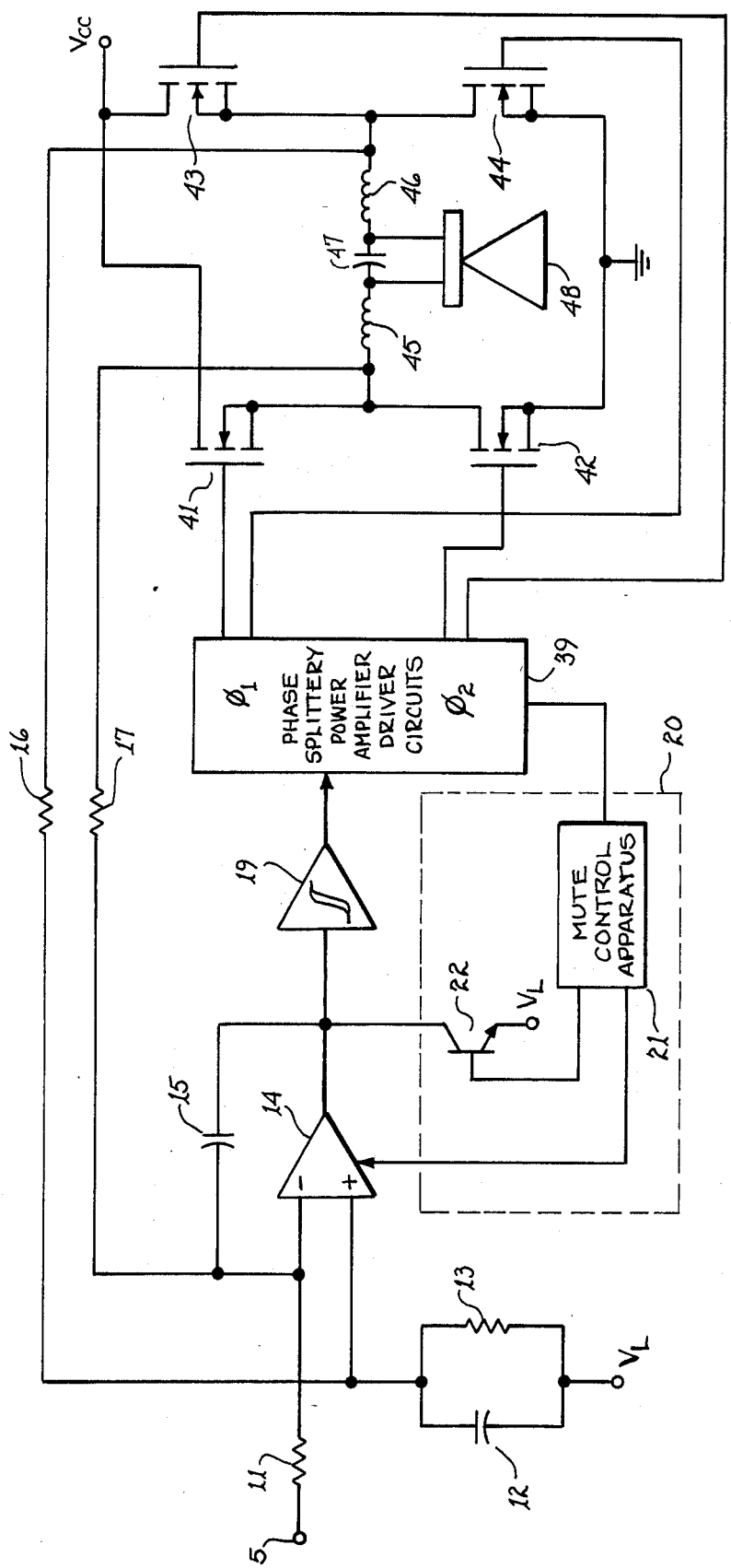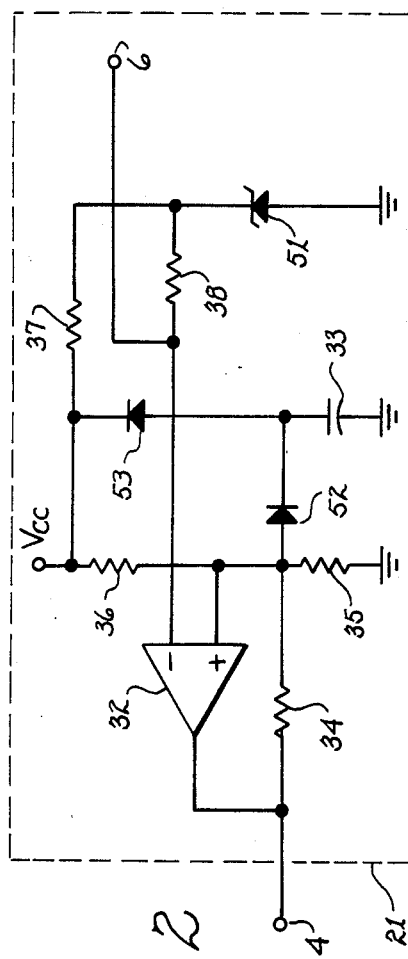
fig.1
fig.2

APPARATUS AND METHOD FOR MUTING AN OUTPUT SIGNAL IN A SWITCHING AMPLIFIER

BACKGROUND OF THE INVENTION

1. Field of the Invention

This invention relates generally to audio switching amplifiers and, more particularly, to audio switching amplifiers that produce an audio output signal as a result of pulse width modulation. This type of audio amplifier can produce irritating noise when the amplifier is turned on or off.

2. Discussion of the Related Art

In power switching amplifiers that are used for audio sound reproduction, such as would be used in an automobile radio, undesirable audio components have been encountered during the turn-on and turn-off operation. The power switching amplifier is subjected to transient voltage conditions that can result in a signal being applied to the speaker having random components. To eliminate this source of undesirable sound or noise, apparatus has been used to silence or mute the output signal of the power amplifiers applied to the speakers during these transient conditions.

A need has therefore been felt for a circuit to mute the output of the power switching amplifier during turn-on and turn-off conditions of the circuit that is both effective in reducing undesired components in the output signal of the power amplifier units and easily implemented.

SUMMARY OF THE INVENTION

It is therefore an object of the present invention to provide an improved audio switching amplifier.

It is a further object of the present invention to provide an audio switching amplifier in which undesirable signal components are minimized during transient conditions.

It is still a further object of the present invention to provide an audio switching amplifier for use in an automobile radio that eliminates unpleasant signal components during a power-up and power-down condition of the radio.

The aforementioned and other objects are accomplished, according to the present invention, by an audio switching amplifier in which a feedback signal, controlling amplifier switching, has the pulse width of the switching cycle modified by an audio input signal. The audio input signal modifies the pulse widths of the output switching amplifiers. The switching amplifiers provide an output signal that, when integrated in the filters associated with the speaker, reproduce the input audio signal. To eliminate undesired noise signals during transient conditions, such as power-up and power-down of the amplifier circuits, mute control apparatus is provided. The mute control apparatus temporarily, during power-up, removes all signals from the speaker for a predetermined period of time. Removal of the signals includes biasing the output power switching amplifier units in an off condition, controlling an output signal of an integrating amplifier that controls the width of the pulses and disabling the integrating amplifier. Upon resumption of operation, a minimum of transients are experienced at the speaker. During power-down, similar conditions are imposed on the audio amplifier immediately upon removal of the power supply voltage.

These and other features of the present invention will be understood upon reading of the following description along with the drawings.

BRIEF DESCRIPTION OF THE DRAWINGS

FIG. 1 is a schematic block diagram of an audio switching amplifier using a mute apparatus in accordanace with this invention.

FIG. 2 is a schematic circuit diagram of a mute control apparatus used in the diagram of FIG. 1.

DESCRIPTION OF THE PREFERRED EMBODIMENT

Detailed Description of the Drawings

Referring to FIG. 1, an input signal is applied to terminal 5 and through resistor 11 to an inverting terminal of differential amplifier 14. The inverting terminal of differential amplifier 14 is coupled through capacitor 15 to an output terminal of differential amplifier 14 and to a first terminal of resistor 17. The non-inverting terminal of differential amplifier 14 is coupled through capacitor 12 and through resistor 13 to voltage $V_L$ and to a first terminal of resistor 16. The output terminal of differential amplifier 14 is coupled to Schmitt trigger circuit 19 and to a collector terminal of NPN transistor 22. An emitter terminal of transistor 22 is coupled to the voltage $V_L$, while a base terminal of transistor 22 is coupled to mute control apparatus 21. Transistor 22 and mute control apparatus 21 are portions of the mute apparatus 20. The mute control apparatus 21 is coupled to differential amplifier 14 and to phase splitter/power amplifier driver circuits 39. The output terminal of the Schmitt trigger circuit 19 is coupled to the phase splitter/power amplifier driver circuits 39. First phase signals from phase splitter/power amplifier driver circuits 39 are coupled to gate terminals of field effect transistor (FET) devices 41 and 44, while second phase signals from phase splitter/power amplifier driver circuits 39 are coupled to gate terminals of FET devices 42 and 43. Drain terminals of FET devices 41 and 43 are coupled to supply voltage Vcc, while source terminals of FET devices 42 and 44 are coupled to a common (i.e. ground) potential. The source terminal of FET device 41 is coupled to a drain terminal of FET device 42, to a second terminal of resistor 17 and to a first terminal of inductor 45. A source terminal of FET device 43 is coupled to a drain terminal of FET device 44, to a second terminal of resistor 16 and to a first terminal of inductor 46. A second terminal of inductor 45 is coupled through capacitor 47 to a second terminal of inductor 46 and through impedance (speaker) 48 to a second terminal of inductor 46.

Referring to FIG. 2, an output terminal of differential amplifier 32 is coupled to terminal 4 and to a first terminal of resistor 34. A second terminal of resistor 34 is coupled through resistor 35 to the ground potential, to the non-inverting input terminal of differential amplifier 32, to an anode of diode 52 and to a first terminal of resistor 36. The cathode terminal of diode 52 is coupled through capacitor 33 to the common potential and to an anode terminal of diode 53 which, in turn, has its cathode coupled to a second terminal of resistor 36, to the supply voltage Vcc and to a first terminal of resistor 37. A second terminal of resistor 37 is coupled to a cathode terminal of zener diode 51 and to a first terminal of resistor 38. An anode terminal of diode 51 is coupled to the common potential. A second terminal of resistor 38 is coupled to an inverting terminal of differential amplifier 32 and to terminal 6.

Operation of the Preferred Embodiment

Referring once again to FIG. 1, the operation of the audio power switching amplifier can be understood as follows. The Schmitt trigger circuit 19 applies signals to the phase splitter/power amplifier driver circuit 39. The signals are pulses of various widths and the pulse widths are determined by the output signals from integrating differential amplifier 14. In response to the output signals from the Schmitt trigger circuit, the combination of transistors 41 and 44 alternates with the combination of transistors 43 and 42 in being biased in the conducting state. The components 45, 46 47 and 48 act as an integrating circuit and provide an amplitude of an output signal (i.e. through speaker 48) determined by the width of the pulse. When the combination of transistors in the conducting state changes, the input signal applied to the amplifier 14 changes. Capacitors 12 and 15 control the rise time at the output of amplifier 14 and thus control the interval between actuation of the Schmitt trigger. This interval, in turn, controls the length of time that the combination of the output transistors (i.e. 41, 44) are in a conductive state and the length of time that the alternative combination of transistors (i.e. 43, 42) is in the conductive state. The rise-time of the signal at the output terminal of amplifier 14 is also controlled and by the (audio) signal applied to terminal 5.

The mute control apparatus 21 can provide a disabling signal to phase splitter/output amplifier driver circuit 39. This disabling signal switches all of the output power transistors to an off position and therefore no current flows through speaker 48. In addition, the mute control apparatus causes the output terminal of amplifier 14 to be at the potential $V_L$ through the action of transistor 22. The mute control apparatus inactivates the amplifier 14 to avoid discharging of capacitors 15 and 12. Capacitors 15 and 12 are charged to a static charge condition corresponding to zero audio signal, so that no transients due to the settling time of these capacitors appear on the speaker.

Referring once again to FIG. 2, when power is applied to the Vcc terminal, resistor 37 and Zener diode 51 provide an instantaneous voltage to the inverting input terminal of differential amplifier 32, and provide a low signal at terminal 4. The non-inverting terminal of amplifier 32 rises at a rate determined by resistor 36, diode 52 and capacitor 33. When the non-inverting terminal of amplifier 32 reaches a voltage greater than the inverting terminal, the muting signal is cut-off. When the supply voltage Vcc is removed, the non-inverting terminal falls rapidly because diode 52 no longer has current flowing therethrough, and capacitor 33 can be discharged through diode 53. Thus the inverting terminal is once again high and the muting signal is activated.

The foregoing description is included to illustrate the operation of the preferred embodiment and is not meant to limit the scope of the invention. The scope of the invention is to be limited only by the following claims. From the foregoing description, many variations will be apparent to one skilled in the art that would yet be encompassed by the spirit and scope of the invention.

What is claimed is:

1. In a power switching amplifier in which an integrating circuit, responding to an input audio signal and signals from output power amplifiers, controls a pulse width of output signals activating a speaker system, apparatus for controlling noise signals resulting from transient conditions comprising:
    switching apparatus for maintaining said output power amplifiers in a non-conducting state; and
    transistor apparatus for controlling a signal at an output terminal of said integrating circuit.

2. The noise control apparatus of claim 1 wherein said switching apparatus and said transistor apparatus are activated for a predetermined period of time when said power switching amplifier is turned on.

3. The noise controlling apparatus of claim 2 wherein said noise control apparatus is activated upon removal of a supply voltage from said power switching amplifier.

4. The method of preventing noise signals in a power switching amplifier during transient supply voltage conditions in a switching power amplifier comprising the steps of:
    switching off output transistors of said power switching amplifier; and
    establishing a predetermined voltage level at an output of an amplifier circuit controlling a pulse width of signals activating said output transistors.

5. The method of preventing noise signals of claim 4 further including the step of disabling said amplifier circuit.

6. The method of preventing noise signals of claim 4 further including the steps of: activating said switching off and said establishing steps immediately after application of supply voltage to said switching power amplifier; and, disabling said switching off and said establishing steps a predetermined period of time after said application of supply voltage.

7. An audio power switching amplifier for driving a speaker circuit comprising:
    a plurality of power transistors;
    driving circuit means coupled to said plurality of power transistors for applying current in alternative directions through said speaker circuit;
    a Schmitt trigger circuit for activating said driving circuit means;
    differential amplifier means coupled to said power transistors and to an input audio signal for controlling output signals of said Schmitt trigger circuit, said Schmitt trigger output signals controlling current applied to said speaker circuit; and
    mute control apparatus means for applying a first signal to said driving circuit means, said first signal causing said power transistors to be in a non-conducting state, said mute control apparatus means applying a second signal to an output terminal of said differential amplifier means.

8. The audio power switching amplifier of claim 7 wherein said first and said second signals are applied for a predetermined time after application of a supply voltage to said driving circuit means.

9. The audio power switching amplifier of claim 7 wherein said first and said second signals are applied after removal of power from said driving circuit means.

* * * * *